United States Patent
Zhang et al.

(10) Patent No.: US 8,104,166 B1
(45) Date of Patent: Jan. 31, 2012

(54) SELF-ALIGNED METHOD FOR FABRICATING A HIGH DENSITY GMR READ ELEMENT

(75) Inventors: Jinqiu Zhang, Fremont, CA (US); Ming Zhao, Fremont, CA (US); Mohamad T. Krounbi, San Jose, CA (US); Henry Yuan, Fremont, CA (US); Lien-Chang Wang, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 2537 days.

(21) Appl. No.: 10/741,857

(22) Filed: Dec. 19, 2003

(51) Int. Cl.
*G11B 5/127* (2006.01)
*H04R 31/00* (2006.01)

(52) U.S. Cl. ........ 29/603.16; 29/603.13; 29/603.14; 29/603.15; 29/603.18; 216/62; 216/65; 216/66; 360/324; 360/325; 360/326; 360/327; 204/192.15; 451/5; 451/41

(58) Field of Classification Search .......... 29/603.07, 29/603.11, 603.13–603.16, 603.18; 216/62, 216/65, 66; 360/324–327; 451/5, 41; 204/192.15
See application file for complete search history.

(56) References Cited

U.S. PATENT DOCUMENTS

| | | | |
|---|---|---|---|
| 5,434,826 A * | 7/1995 | Ravipati et al. | 367/140 |
| 6,770,382 B1 * | 8/2004 | Chang et al. | 428/811.3 |
| 7,005,242 B2 * | 2/2006 | Jayasekara | 430/320 |
| 2005/0045580 A1 * | 3/2005 | Baer et al. | 216/22 |

* cited by examiner

*Primary Examiner* — Paul D Kim

(57) ABSTRACT

A method is provided for fabricating a read element with leads that overlay a top surface of a sensor of the read element. The method includes forming a mask over a sensor layer, then using the mask to define the sensor from the sensor layer. The mask is then narrowed and a lead layer is formed that overlays both ends of the top surface of the sensor without covering a center portion of the top surface.

32 Claims, 6 Drawing Sheets

SELF-ALIGNED METHOD FOR FABRICATING A HIGH DENSITY GMR READ ELEMENT

BACKGROUND OF THE INVENTION

1. Field of the Invention

The present invention relates generally to the field of magnetic disk drives, and more particularly to a method for manufacturing read sensors for magnetic disk drives.

2. Description of the Prior Art

Magnetic disk drives are used to store and retrieve data for digital electronic apparatuses such as computers. In FIGS. 1 and 2, a magnetic disk data storage system 10 includes a sealed enclosure 12, a disk drive motor 14, and a magnetic disk, or media, 16 supported for rotation by a drive spindle 17 of motor 14. Also included are an actuator 18 and an arm 20 attached to an actuator spindle 21 of actuator 18. A suspension 22 is coupled at one end to the arm 20 and at another end to a read/write head 24. The suspension 22 and the read/write head 24 are commonly collectively referred to as a head gimbal assembly (HGA). The read/write head 24 typically includes an inductive write element and a magnetoresistive read element that are held in a very close proximity to the magnetic disk 16. As the motor 14 rotates the magnetic disk 16, as indicated by the arrow R, an air bearing is formed under the read/write head 24 causing the read/write head to lift slightly off of the surface of the magnetic disk 16, or, as it is commonly termed in the art, to "fly" above the magnetic disk 16. Data bits can be written or read along a magnetic "track" of the magnetic disk 16 as the magnetic disk 16 rotates past the read/write head 24. The actuator 18 moves the read/write head 24 from one magnetic track to another by pivoting the arm 20 and the suspension 22 in an arc indicated by arrows P. The design of magnetic disk data storage system 10 is well known to those skilled in the art.

FIG. 3 shows a cross-sectional view of a read/write head 24. The read/write head 24 includes a write element 30 for writing data bits to the magnetic disk and a read element 32 for reading the data bits. The write element 30 includes a yoke 34 and one or more layers of electrically conductive coils 36 wound around the yoke 34. In operation, an electric current is passed through the coils 36 to induce a magnetic field in the yoke 34. The yoke 34 includes a lower pole 38 connected to an upper pole 40 by a back gap 42 at a back gap end. The lower and upper poles 38, 40 oppose each other across a write gap 44 at an air bearing end. The yoke 34 is commonly formed of ferromagnetic materials.

The read element 32 includes a first shield 46, a second shield 48, a read insulation layer 50 disposed between the first shield 46 and the second shield 48, and a read sensor 52 disposed within the read insulation layer 50 and exposed at an air bearing surface (ABS). In some designs, often referred to as "merged head" designs, second shield 48 and lower pole 38 are the same layer. In other designs, such as the one shown in FIG. 3, a thin insulating layer 54 separates the second shield 48 from the lower pole 38.

The read sensor 52 is typically formed between a set of electrical leads (not shown) so that in operation a variable electrical resistance of the read sensor 52 can be measured by directing a measuring current through the read sensor 52. In a prior art fabrication process, photolithography is used to form a mask over the middle of the read sensor 52 in order to form the leads to either side of the mask. However, any misalignment of the mask translates into a misalignment of the electrical leads which can negatively affect the performance of the read sensor 52. Since many read elements 32 are commonly produced on a wafer before being diced into individual units, a problem with mask alignment at the wafer level can create a significantly lower yield of read elements 32. Accordingly, what is needed is an improved fabrication process for forming electrical leads over a read sensor.

SUMMARY

The invention provides a self-aligned fabrication method for fabricating a read element having electrical leads over a read sensor. The method includes providing a substrate, forming a first shield layer over the substrate, forming a first gap layer over the first shield layer, and forming a sensor layer over the first gap layer, the sensor layer defining a plane having a perpendicular axis. In some embodiments forming the sensor layer includes forming two ferromagnetic layers separated by a dielectric layer and can further include forming an antiferromagnetic layer adjacent to one of the two ferromagnetic layers. The method further includes forming a mask over a masked portion of the sensor layer, and forming a sensor, including first and second ends, from the masked portion of the sensor layer. In some embodiments, forming the sensor includes ion beam etching and can also include forming continuous junction sidewalls. The method further includes forming a hard bias layer over the first gap layer and adjacent to the sensor, and forming a protective layer over the hard bias layer and the first and second ends of the sensor. The method further includes narrowing the mask and forming a lead layer over the hard bias layer and over the first and second ends of the sensor. The method further includes removing the mask to expose a center portion of a top surface of the sensor, forming a second gap layer over the center portion of the top surface of the sensor and over the first and second leads, and forming a second shield layer over the second gap layer.

In some embodiments forming the mask includes forming a masking layer and patterning the masking layer. In some of these embodiments forming the masking layer includes forming a first mask layer over the sensor layer and a second mask layer over the first mask layer. The first and second mask layers can be made of different materials, for example, the first mask layer can be formed of poly(methyl ethylene glycol)imide copolymer and the second mask layer can be formed of photoresist. In some embodiments patterning the masking layer includes selectively exposing the masking layer to an illumination, a developing step, and a chemical etch.

In some embodiments, narrowing the mask includes ion beam etching and can include static ion beam etching of a first side of the mask and static ion beam etching of a second side of the mask. In some embodiments the static ion beam etching of the first and second sides is performed at an angle approximately 70° from the perpendicular axis to the plane defined by the sensor layer. Static ion beam etching of the sides can be performed either continuously or in successive cycles, for example, continuously for approximately two minutes per side, or in two approximately one minute cycles per side. In some embodiments the mask has a first width as formed and a second width after narrowing, the second width being the first width reduced by approximately 15% to 18%.

In some embodiments, forming the hard bias layer includes forming multiple layers of hard magnetic materials which can include depositing layers of chromium and depositing a layer of CoPt over the chromium layers. In some embodiments, forming the protective layer includes depositing a layer of tantalum, which can include depositing approximately 100 Å of tantalum at a high angle, such as approximately 23°, and depositing approximately 100 Å of tantalum at a low angle, such as approximately 0°, where both angles are measured relative to the perpendicular axis to the plane defined by the sensor layer. In some embodiments, forming the first and second leads includes ion beam deposition, and in some embodiments the first and second leads are formed of two layers of tantalum and a gold (Au) layer disposed there between.

In another method of the invention a read sensor in fabricated by forming a sensor layer defining a plane having a perpendicular axis, forming a mask over a masked portion of the sensor layer, forming a sensor, including first and second ends, from the masked portion of the sensor layer, narrowing the mask, and forming a first lead over the first end and a second lead over the second end. The method also can include forming a first shield layer beneath the sensor layer, forming a first gap layer between the sensor layer and the first shield layer, and forming a hard bias layer adjacent to the sensor layer. The method can also include removing the mask to expose a center portion of a top surface of the sensor, forming a second gap layer over the center portion of the top surface of the sensor and over the first and second leads, and forming a second shield layer over the second gap layer.

DETAILED DESCRIPTION OF THE INVENTION

The present invention provides a method for fabricating a read element with leads that overlay a top surface of a sensor. The method includes forming a mask over a sensor layer, then using the mask to define the sensor from the sensor layer. The mask is then narrowed, for example, by static ion beam etching. Thereafter, a lead layer is formed. The narrower mask prevents the lead layer from covering the entire top surface of the sensor while allowing the lead layer to be formed such that it overlays both ends of the top surface.

Figure 1:
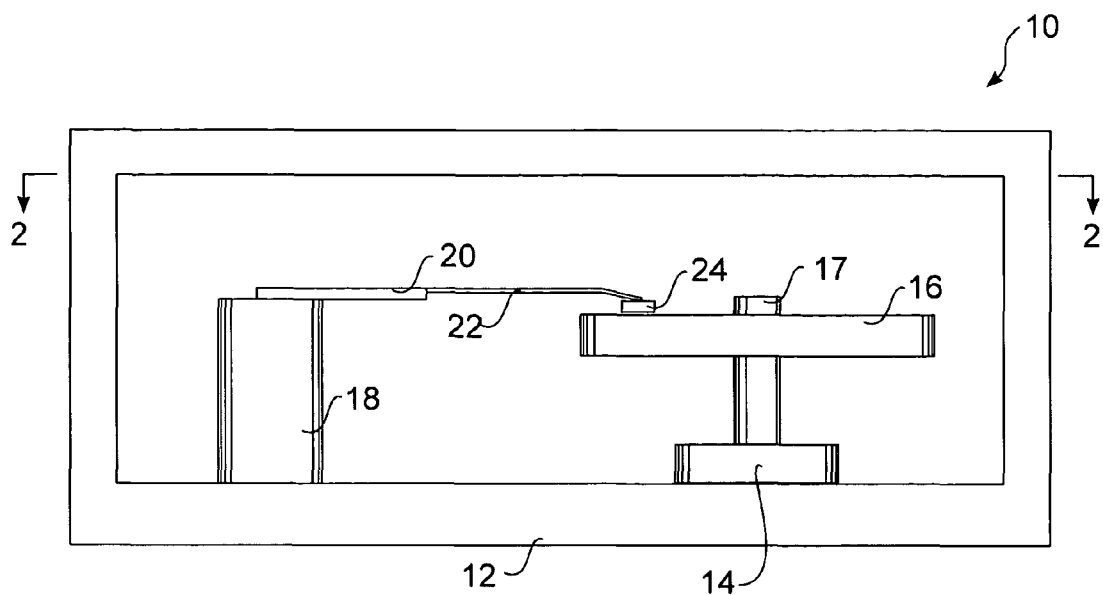
FIG. 1 is a partial cross-sectional view of a magnetic data storage system according to the prior art.
Figure 2:
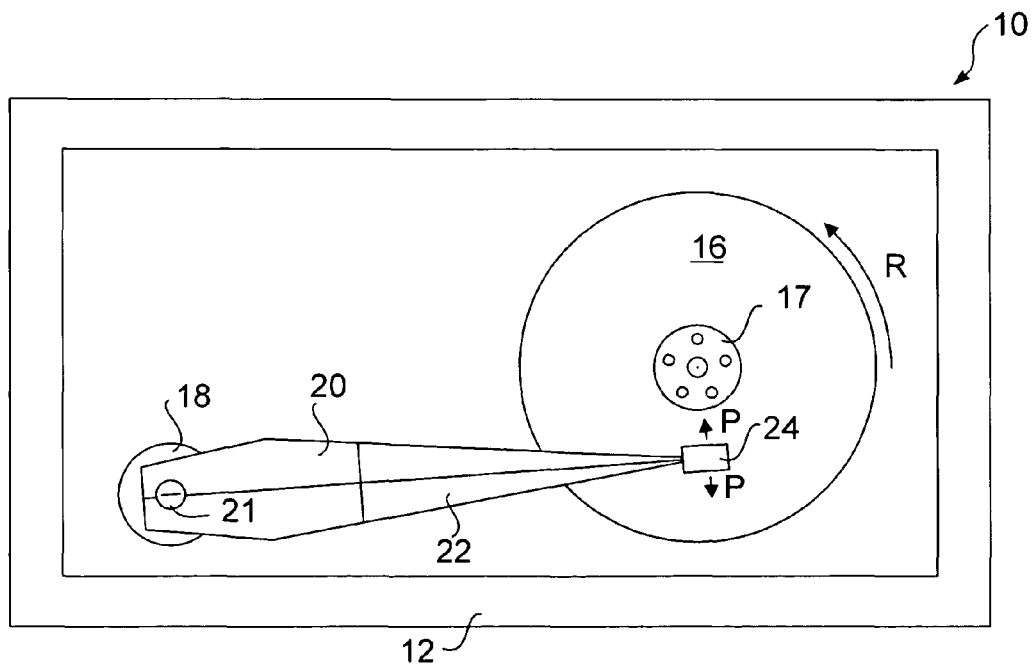
FIG. 2 is a partial cross-sectional view taken along line 2-2 of FIG. 1.
Figure 3:
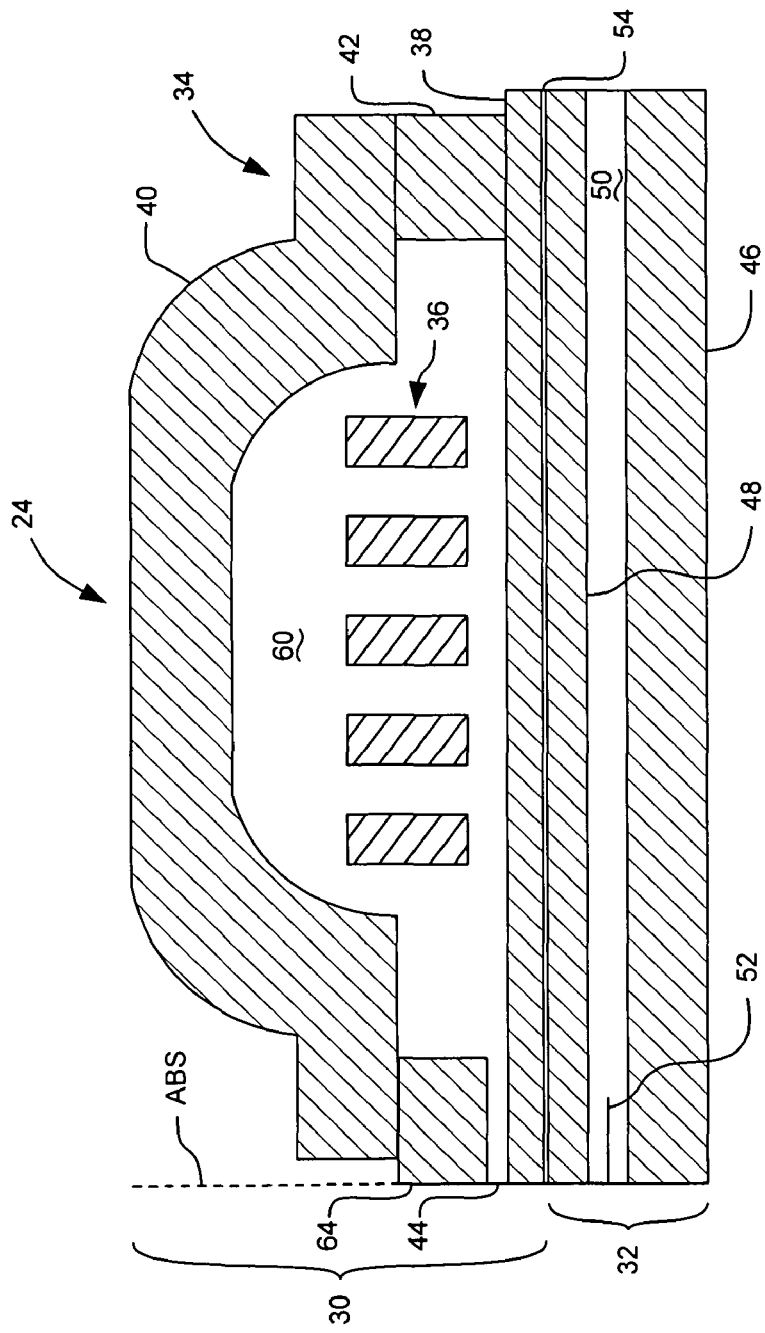
FIG. 3 is a cross-sectional view of a read/write head of the prior art.
Figure 4:
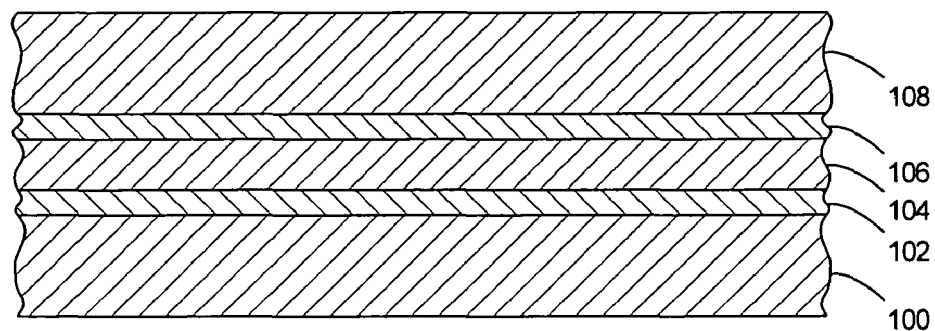
FIGS. 4-13 are cross-sections of partially fabricated read elements at successive stages of fabrication according to an embodiment of the invention.

FIG. 4 is a cross-section of a partially fabricated read element. While the invention can be used to form a single read element, it can also be employed in a batch process to simultaneously form a plurality of read elements. Accordingly, to achieve the partially fabricated read element of FIG. 4, a shield layer 100 is preferably formed on a substrate such as a silicon wafer (not shown). A gap layer 102 is formed above the shield layer 100, and a sensor layer 104 is formed above the gap layer 102.

The shield layer 100 is formed of a ferromagnetic material such as NiFe and can be formed, for example, by plating to a thickness of about 1.5μ to 2μ. The gap layer 102 is formed of a dielectric material such as alumina ($Al_2O_3$) to insulate the shield layer 100 from the sensor layer 104. Typical thicknesses for gap layers such as gap layer 102 are about 100 Å.

The sensor layer 104 is a layer from which a read sensor, such as a Giant Magnetoresistive (GMR) read sensor, can be later fabricated. In those embodiments in which the sensor layer 104 is meant to form a GMR read sensor, the sensor layer 104 is a multi-layered stack, approximately 300 Å to 350 Å thick, comprising at least two ferromagnetic layers separated by a dielectric layer. One of the ferromagnetic layers has a magnetization that is pinned in a fixed orientation, typically by an adjacent antiferromagnetic pinning layer. As will become apparent, the present invention will work equally well with any type of read sensor, regardless of the specific arrangement of layers, and accordingly, the sensor layer 104 is simply represented herein as a single layer.

With continued reference to FIG. 4, two layers of mask material are formed over the sensor layer 104, a first mask layer 106 and a second mask layer 108. The first mask layer 106 can be formed, for example, from poly(methyl ethylene glycol)imide copolymer (PMGI) by spin-coating followed by a baking process. In some embodiments the first mask layer 106 is formed with a thickness of approximately 500 Å to 800 Å. The second mask layer 108 can be formed, for example, from photoresist, also by spin coating. In some embodiments the second mask layer 108 is formed with a thickness of approximately 0.2μ to 0.4μ.

Figure 5:
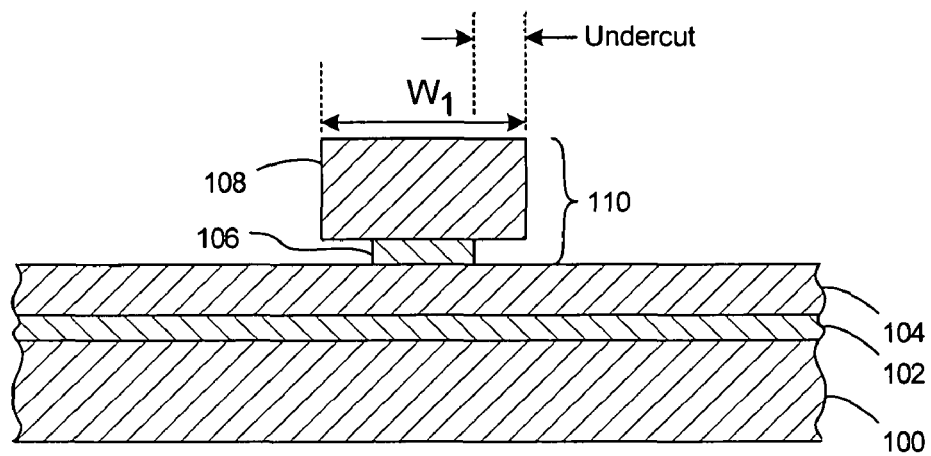

FIG. 5 is a cross-section of the partially fabricated read element of FIG. 4 after subsequent processing. In FIG. 5 the first and second mask layers 106 and 108 have been patterned to form a mask 110 over a masked portion of the sensor layer 104. The first and second mask layers 106 and 108 can be patterned with conventional photolithographic techniques, for instance, by selectively exposing second mask layer 108 to an illumination followed by a developing step. The developing step is followed by a chemical etch that is more aggressive towards the first mask layer 106 than the second mask layer 108 in order to form the undercut shown in FIG. 5.

The top layer of the mask 110, formed from the second mask layer 108, has a first width $W_1$ that in some embodiments equals approximately 0.2μ. The bottom layer of the mask 110, formed from the first mask layer 106, is in some embodiments undercut relative to the top layer by approximately 300 Å to 500 Å on each side. Although shown in FIG. 5 as having substantially straight and parallel sidewalls, in some embodiments the bottom layer of the mask 110 has sidewalls that flare outward. In these embodiments the bottom layer of the mask 110 is broadest where it meets the sensor layer 104.

Figure 6:
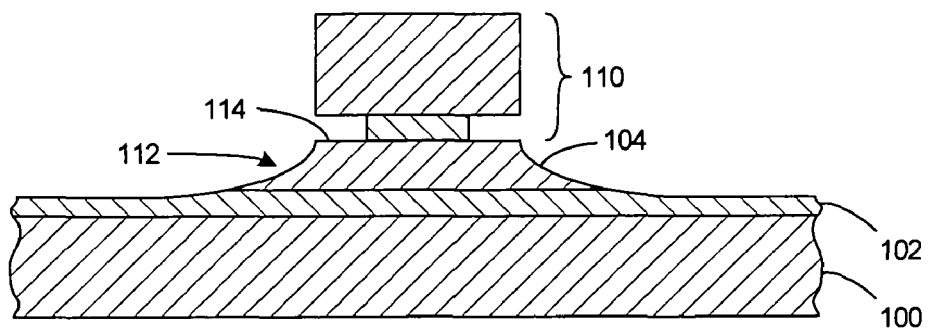

FIG. 6 is a cross-section of the partially fabricated read element of FIG. 5 after sidewalls 112 of a read sensor 114 have been defined from the sensor layer 104, leaving essentially only the masked portion of the sensor layer 104. A read sensor 114 with sidewalls 112 as shown in FIG. 6 is commonly referred to as having a continuous junction (CJ) design. Sidewalls 112 are formed, in some embodiments, by ion beam etching (IBE) at an angle approximately normal to the surface of the substrate (i.e., the ion beam originates at a point nearly directly above the mask 110). The ion beam etching is performed until the sensor layer 104 is completely etched through and typically etches slightly into the gap layer 102. The endpoint of the ion beam etching can be detected optically, for example, by detecting the material of the gap layer 102.

Figure 7:
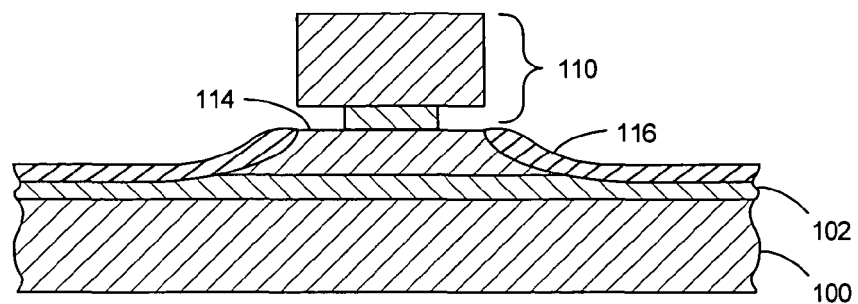

FIG. 7 is a cross-section of the partially fabricated read element of FIG. 6 after a hard bias layer 116 has been formed adjacent to the sensor 114 and over the sidewalls 112. In some embodiments the hard bias layer 116 is formed of multiple layers of hard magnetic materials through multiple deposition steps. In some of these embodiments layers of chromium (Cr) are deposited over the gap layer 102 followed by a layer of CoPt over the chromium layers. The layers of the hard bias layer 116 can be deposited, for example, by ion beam deposition (IBD).

Figure 8:
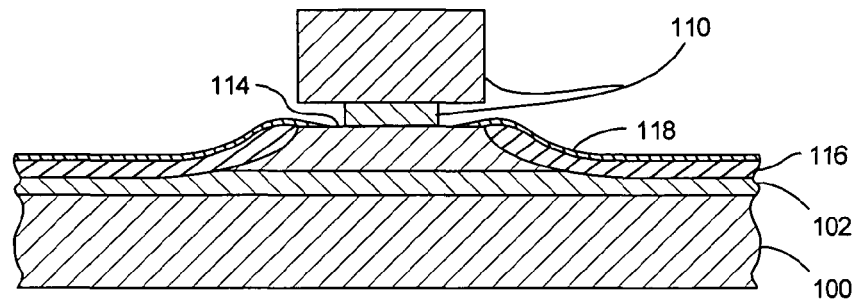

FIG. 8 is a cross-section of the partially fabricated read element of FIG. 7 after a protective layer 118 has been formed over the hard bias layer 116 and over both ends of a top surface of the sensor 114, as shown. The protective layer 118 can be formed of a material such as tantalum (Ta), for example, by IBD. In some embodiments the tantalum is deposited in two deposition steps. In a first deposition step approximately 100 Å of tantalum is deposited at a high angle and in a second deposition step approximately 100 Å of tantalum is deposited at a low angle. Exemplary high and low angles are approximately 23° and 0° as measured from an axis perpendicular to the substrate (e.g., axis 122 in FIG. 9). The high angle deposition is particularly suited to forming the protective layer 118 such that it is disposed over the exposed ends of the top surface of the sensor 114.

Figure 9:
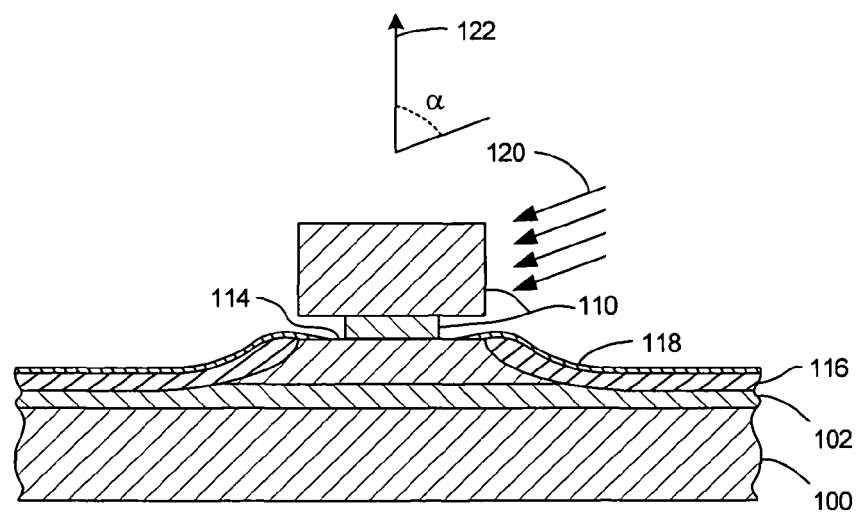

FIG. 9 is a cross-section of the partially fabricated read element of FIG. 8 during a process intended to narrow the mask 110. Narrowing can be achieved, for example, by ion beam etching and more particularly with a static ion beam etch (SIBE), as shown in FIG. 9. In some of these embodiments the ion beam 120 is a beam of argon ions directed at the mask 110 at a relatively high milling angle, α, that in some embodiments is approximately 70° from an axis 122 perpendicular to the substrate. It should be noted that in a conventional ion beam etch process the substrate being etched is continuously rotated. In the present static ion beam etch process, however, the substrate is held in a fixed orientation with respect to the ion beam 120 so that the ion beam 120 impinges on the side of the mask 110 from a consistent direction.

Referring back to FIG. 6, the ion beam etching used to remove portions of the sensor layer 104 can also cause a thin layer of the etched material to redeposit on the sides of the mask 110. Similarly, the formation of the hard bias layer 116 and the protective layer 118 can also add additional material to the sides of the mask 110. Referring again to FIG. 9, the static ion beam etch initially removes any such added materials (not shown) from the side of the mask 110, then etches the side of the mask 110 to cause a narrowing thereof. The static ion beam etch, in some embodiments, removes approximately 300 Å from the side of the mask 110.

The static ion beam etch can be either a continuous or a cycled process. In one exemplary static ion beam process, the side of the mask 110 is continuously etched for 2 minutes. In another exemplary static ion beam process, the side of the mask 110 is etched for two 1 minute cycles separated by a rest period that in some embodiments is also for 1 minute. In yet another exemplary static ion beam process, the side of the mask 110 is etched for three 1 minute cycles, where the cycles are separated by rest periods.

Figure 10:
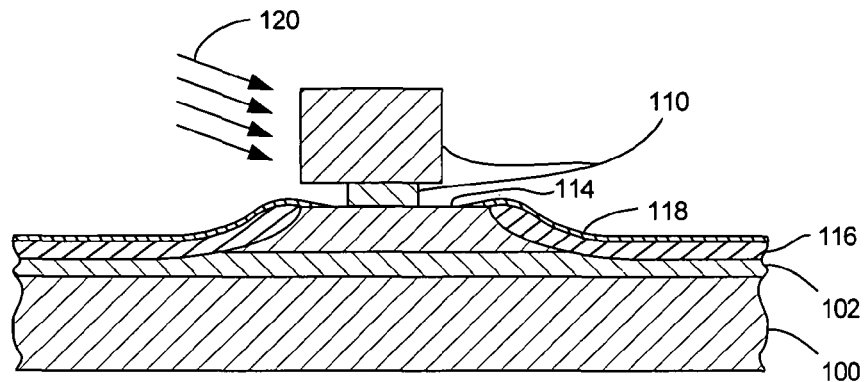

After the side of the mask 110 is sufficiently narrowed, the other side of the mask 110 can be similarly narrowed, as shown in FIG. 10. Although FIG. 10 shows the ion beam 120 as having moved to the opposite side of the mask 110, it will be appreciated that the typical ion beam etching system produces only a single ion beam, and therefore in some embodiments the other side of mask 110 is exposed to the ion beam 120 by rotating the wafer through 180° around the axis 122. It will be understood that a properly configured dual ion beam system can simultaneously etch both sides of mask 110.

Figure 11:
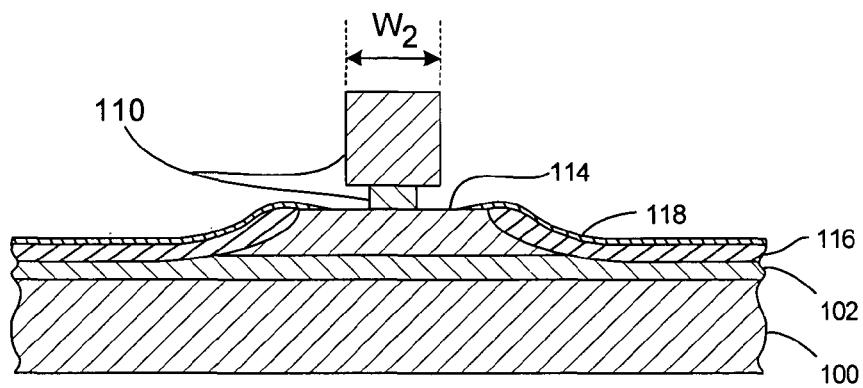

FIG. 11 shows a cross-section of the partially fabricated read element following the completion of the static ion beam etching. It can be seen that a second width, $W_2$, of the mask 110 after narrowing is less than the first width, $W_1$. In some embodiments $W_1$ is narrowed by approximately 15% to 18% to achieve $W_2$.

The protective layer 118 protects the hard bias layer 116 and the sensor 114 from damage during the narrowing of the mask 110. Accordingly, in those embodiments that employ static ion beam etching, it is important to optimize the static ion beam etch parameters to be able to sufficiently narrow the mask 110 without completely removing the protective layer 118, which would expose the hard bias layer 116 and the sensor 114 to potential etching damage. Selectivity is a useful parameter for optimizing the static ion beam etch as selectivity is a ratio of the etch rates of two materials, for example, the ratio of the etch rate of photoresist to that of tantalum. Thus, in the context of the example where the mask 110 is formed of photoresist and the protective layer 118 is formed of tantalum, a meaningful selectivity is the ratio of the rate at which the mask 110 is narrowed to the rate at which the protective layer 118 is removed.

Typically, a selectivity for two materials is determined with the ion beam set at a common incident angle relative to the surfaces of both materials. However, it will be appreciated that, in the static ion beam etches of FIGS. 9 and 10, a surface of the etched side of the mask 110 is approximately perpendicular to a surface of the protective layer 118. Therefore, while the milling angle, α, is essentially the incident angle to the protective layer 118, the incident angle to the surface of the etched side of the mask 110 is essentially the complementary angle, 90°-α. Accordingly, it will be understood that selectivity in the present context is a ratio of the etch rate of the mask 110 in a first direction to the etch rate of the protective layer 118 in a second direction that is essentially perpendicular to the first direction.

Table 1, below, provides experimentally determined etch rates as a function of the milling angle, α, for static ion beam etching with argon ions of both photoresist and tantalum. Table 1 additionally shows the variation in selectivity as a function of milling angle. It can be seen from Table 1 that, for the particular etching conditions, selectivity is maximized at a milling angle of 70°. Accordingly, a static ion beam etch at a milling angle of 70° will provide the greatest degree of trimming of the mask 110 before the protective layer 118 is etched through.

TABLE 1

Etch Rates and Selectivities as a Function of Milling Angle

| Milling Angle | Photoresist Etch Rate (Å/min) | Ta Etch Rate (Å/min) | Selectivity |
|---|---|---|---|
| 20 | 106.7 | 72.6 | 1.47 |
| 45 | 99.7 | 71.9 | 1.39 |
| 60 | 67.7 | 50.9 | 1.33 |
| 70 | 54.6 | 31.3 | 1.74 |

It will be appreciated that using materials for the protective layer 118 and the mask 110, other than those described above, will likely require different conditions for the static ion beam etch. Likewise, changing parameters such as the type of ion used in the ion beam etch, say from argon to xenon, will also likely affect the selectivity and therefore may require a different milling angle. Although a static ion beam method for narrowing the mask 110 has been described in particular detail, it will also be appreciated that narrowing the mask 110 can be achieved by other methods as well. For example, the mask 110 can also be narrowed by Reactive Ion Etching (RIE).

Figure 12:
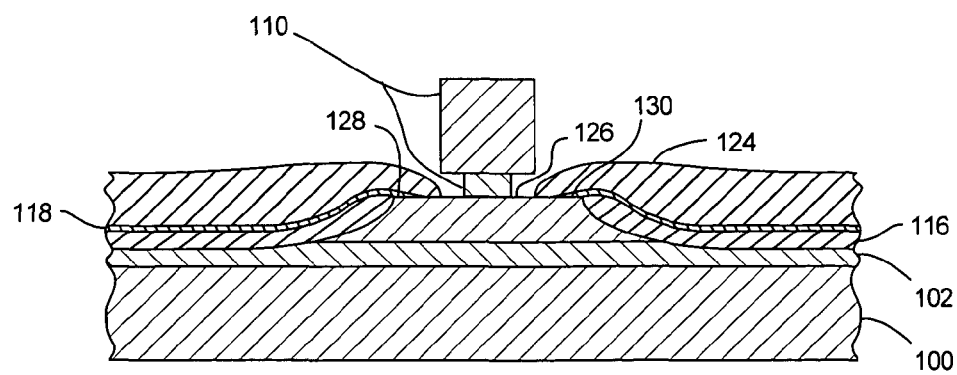

FIG. 12 is a cross-section of the partially fabricated read element of FIG. 11 after a lead layer 124 has been formed. The lead layer 124 is preferably formed of a highly electrically conductive material, for example, by IBD. In some embodiments the lead layer is two layers of tantalum with a layer of gold disposed between them. The mask 110 prevents the lead layer 124 from being deposited over a center portion 126 of the top surface of the sensor 114, but does allow the lead layer 124 to be formed over first and second ends 128 and 130 of the top surface of the sensor 114. Accordingly, the lead layer 124 forms a first lead over the first end and a second lead over the second end.

Figure 13:
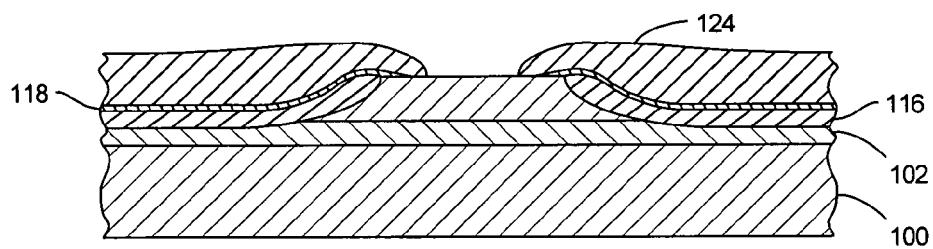

FIG. 13 is a cross-section of the partially fabricated read element of FIG. 12 after the mask 110 has been removed. The mask 110 is typically removed by a rinsing process, commonly called "lift-off," that uses a chemical solution to dissolve the mask 110 and release it from the top surface of the sensor 114. Once the mask 110 has been removed, the read element is completed by covering the lead layer 124, and an exposed portion of the sensor 114 (the center portion 126 of the top surface of the sensor 114 referenced in the above paragraph), with a second gap layer, and then covering the second gap layer with a second shield layer (both not shown).

It can be seen from FIGS. 12 and 13 that narrowing the mask 110 allows the lead layer 124 to extend partially over the top surface of the sensor 114 to form the first and second leads. Placing the first and second leads over the ends of the top surface of the sensor 114 allows a measuring current to be introduced through the top surface of the sensor 114 rather than through the hard bias layer 116 and then in through the sides of the sensor 114. When the measuring current passes from the hard bias layer 116 and in through the sides of the sensor 114 it can pass through magnetically dead zones that tend to exist at either end of the sensor 114 adjacent to the hard bias layer 116. Having the lead layer overlay the top surface of the sensor 114 advantageously improves the sensitivity of the sensor 114 because it betters allows the measuring current to avoid passing through these magnetically dead zones.

It can also be seen from FIGS. 6-12 that the method of the invention is advantageously self-aligned. The concept can best be understood with reference to a process that is not self-aligned. For example, common microfabrication processes involve the use of multiple repetitions of a basic method involving depositing a layer over a substrate, forming a mask, etching the layer to define certain features, and removing the mask. Each time a new mask is formed it is critical to carefully position the mask relative to the substrate so that the new mask is properly aligned with the previously defined features. Any misalignment in the new mask with the previously defined features can cause misalignment between features in successively created layers, causing lower yields, for example. In the present invention the process is self-aligned because only a single mask is used. Thus, the center portion of the top surface of the sensor is approximately centered over the sensor, and the first and second leads are essentially symmetrically disposed around the center portion.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A method for fabricating a read element, comprising:
   forming a sensor layer defining a plane having a perpendicular axis;
   forming a mask over a masked portion of the sensor layer;
   forming a sensor, including first and second ends, from the masked portion of the sensor layer;
   narrowing, after forming the sensor, the mask; and
   forming a first lead over the first end and a second lead over the second end.

2. The method of claim 1 wherein forming the sensor layer includes forming two ferromagnetic layers separated by a dielectric layer.

3. The method of claim 2 wherein forming the sensor layer further includes forming an antiferromagnetic layer adjacent to one of the two ferromagnetic layers.

4. The method of claim 1 wherein forming the mask includes forming a masking layer and patterning the masking layer.

5. The method of claim 4 wherein forming the masking layer includes forming a first mask layer over the sensor layer and a second mask layer over the first mask layer.

6. The method of claim 5 wherein the first and second mask layers are formed of different materials.

7. The method of claim 5 wherein the first mask layer is formed of poly(methyl ethylene glycol)imide copolymer and the second mask layer is formed of photoresist.

8. The method of claim 4 wherein patterning the masking layer includes selectively exposing the masking layer to an illumination, a developing step, and a chemical etch.

9. The method of claim 1 wherein forming the sensor includes forming continuous junction sidewalls.

10. The method of claim 1 wherein forming the sensor includes ion beam etching.

11. The method of claim 1 wherein narrowing the mask includes ion beam etching.

12. The method of claim 1 wherein narrowing the mask includes static ion beam etching a first side of the mask and static ion beam etching a second side of the mask.

13. The method of claim 12 wherein the static ion beam etching of the first and second sides of the mask is performed at an angle approximately 70° from the perpendicular axis to the plane defined by the sensor layer.

14. The method of claim 12 wherein the static ion beam etching of each of the first and second sides of the mask is performed for approximately two minutes.

15. The method of claim 12 wherein the static ion beam etching of each of the first and second sides of the mask is performed in two approximately one minute cycles.

16. The method of claim 1 wherein forming the first and second leads includes ion beam deposition.

17. The method of claim 1 wherein the first and second leads are each formed of two layers of tantalum and a gold layer disposed between the two tantalum layers.

18. The method of claim 1 further comprising forming a first shield layer beneath the sensor layer.

19. The method of claim 18 further comprising forming a first gap layer between the sensor layer and the first shield layer.

20. The method of claim 1 further comprising forming a hard bias layer adjacent to the sensor.

21. The method of claim 20 wherein the forming the hard bias layer includes forming multiple layers of hard magnetic materials.

22. The method of claim 21 wherein the forming multiple layers of hard magnetic materials includes depositing layers of chromium and depositing a layer of CoPt over the chromium layers.

23. The method of claim 20 further comprising forming a protective layer over the hard bias layer and the first and second ends of the sensor.

24. The method of claim 23 wherein forming the protective layer includes depositing a layer of tantalum.

25. The method of claim 23 wherein forming the protective layer includes depositing approximately 100 Å of tantalum at a high angle and depositing approximately 100 Å of tantalum at a low angle.

26. The method of claim 25 wherein the high angle is approximately 23° and the low angle is approximately 0°, both angles being measured relative to the perpendicular axis to the plane defined by the sensor layer.

27. The method of claim 1 further comprising removing the mask to expose a center portion of a top surface of the sensor.

28. The method of claim 27 further comprising forming a second gap layer over the center portion of the top surface of the sensor and over the first and second leads.

29. The method of claim 28 further comprising forming a second shield layer over the second gap layer.

30. A method for fabricating a read element, comprising:
providing a substrate;
forming a first shield layer over the substrate;
forming a first gap layer over the first shield layer;
forming over the first gap layer a sensor layer defining a plane having a perpendicular axis;
forming a mask over a masked portion of the sensor layer;
forming a sensor, including first and second ends, from the masked portion of the sensor layer;
forming a hard bias layer over the first gap layer;
forming a protective layer over the hard bias layer;
narrowing, after forming the protective layer, the mask; and
forming a lead layer over the hard bias layer and over the first and second ends of the sensor.

31. A self-aligned method for fabricating a read element, comprising:
forming a sensor layer;
forming a mask over the sensor layer;
forming a sensor, including first and second ends, from the sensor layer;
narrowing, after forming the sensor, the mask; and
forming a first lead over the first end and a second lead over the second end.

32. The self-aligned method of claim 31 wherein the mask has a first width as formed and a second width after narrowing, the second width being the first width reduced by approximately 15% to 18%.

* * * * *